United States Patent [19]

Davidson

[11] Patent Number: 5,880,010
[45] Date of Patent: Mar. 9, 1999

[54] ULTRATHIN ELECTRONICS

[75] Inventor: Howard L. Davidson, San Carlos, Calif.

[73] Assignee: Sun Microsystems, Inc., Mountain View, Calif.

[21] Appl. No.: 792,282

[22] Filed: Jan. 31, 1997

Related U.S. Application Data

[63] Continuation of Ser. No. 273,721, Jul. 12, 1994, abandoned.

[51] Int. Cl.$^6$ ................................................. H01L 21/461
[52] U.S. Cl. .................... 438/455; 438/458; 438/459; 438/975; 438/977; 438/7
[58] Field of Search ................................ 438/622, 455, 438/458, 459, 975, 977, 7, 74

[56] References Cited

U.S. PATENT DOCUMENTS

| | | |
|---|---|---|
| 4,131,985 | 1/1979 | Greenwood et al. . |
| 4,829,018 | 5/1989 | Wahlstrom ............................ 437/51 |
| 4,954,458 | 9/1990 | Reid ...................................... 437/51 |
| 5,034,343 | 7/1991 | Rouse et al. ......................... 437/86 |
| 5,087,585 | 2/1992 | Hayashi ............................... 437/915 |
| 5,229,647 | 7/1993 | Gnadinger ........................... 257/785 |
| 5,266,511 | 11/1993 | Takao . |
| 5,318,663 | 6/1994 | Buti et al. ............................ 156/636 |
| 5,382,759 | 1/1995 | Lau et al. ............................ 174/264 |
| 5,426,072 | 6/1995 | Finnila ................................. 437/208 |
| 5,453,404 | 9/1995 | Leedy ................................... 437/203 |
| 5,503,704 | 4/1996 | Bower et al. ........................ 156/281 |
| 5,617,991 | 4/1997 | Pramanick et al. . |

OTHER PUBLICATIONS

"Low Temperature Si$_3$N$_4$ Direct Bonding" by Robert W. Bower, Mohd S. Ismail and Brian E. Roberds, *App. Phys. Lett.* 62 (26), 28 Jun. 1993.

"Future WSI Technology: Stacked Monolithic WSI" by Ronald Williams and Ogden Marsh, *IEEE Transactions on Components, Hybrids, and Manufacturing Technology*, vol. 16, No. 7, Nov. 1993.

*Primary Examiner*—Caridad Everhart
*Attorney, Agent, or Firm*—Blakely Sokoloff Taylor & Zafman

[57] ABSTRACT

An integrated circuit and associated method for reducing total signal propagation delay as well as power consumption and thermal dissipation. The integrated circuit comprises a plurality of active layers coupled together in close proximity. In order to produce the integrated circuit, at least two active layers are removed from their respective substrate after integrated circuit processing. Some of the methods that may be used include Silicon on Insulator ("SOI") and epitaxial etch stop ("EES") processes. After removal of the active layers, at least one via is implemented on a bottom surface of each active layer in order to establish a mechanical and electrical connection between the via and its associated metal interconnects. Thereafter, the active layers are coupled together by ultrasonic welding or through nitride lamination using Titanium Nitride for conductive regions and Silicon Nitride for insulative regions.

19 Claims, 12 Drawing Sheets

ULTRATHIN ELECTRONICS

CROSS-REFERENCES TO RELATED APPLICATIONS

This is a continuation of a U.S. patent application (application Ser. No. 08/273,721) filed Jul. 12, 1994, now abandoned.

BACKGROUND OF THE INVENTION

1. Field of the Invention

The present invention relates to the field of integrated circuits. More specifically, the present invention relates to an integrated circuit comprising a plurality of active layers electrically and mechanically coupled together and a method for providing this integrated circuit.

2. Background of Art Related to the Invention

A majority of semiconductor manufacturers are constructing integrated circuits according to a conventional structure in which the integrated circuit comprises a layer of inactive semiconductive material and a layer of active semiconductive material deposited thereon. Transistors and other electrical components such as resistors and capacitors, are fabricated either within or on an active layer (defined below). The various components of the active semiconductive material are coupled together by a plurality of interconnect lines. The electrical components in the active semiconductive material and interconnect lines are collectively referred to as the "active layer". The active semiconductive material is typically made of doped silicon being 1–5 microns ("$\mu m$") in thickness. The inactive semiconductive material (commonly referred to as the "substrate layer"), has a thickness substantially larger than the active layer, typically being 625 $\mu m$. The substrate layer merely provides sufficient thickness for handling of the integrated circuit during manufacture. As a result, normally less than one-percent (1%) of the volume of the conventional integrated circuit is needed.

Besides defining the operation of the integrated circuit, these plurality of interconnect lines further enable the integrated circuit to operate in association with other integrated circuits to store, process and/or transfer information as a device, subsystem (a combination of devices operating in tandem) and the like. The operational speed of the device is limited by the length and capacitive loading of these interconnect lines. For example, the length and capacitive loading of the interconnect lines coupling together a number of random access memory ("RAM") devices adversely effects the operational speed in storing and retrieving information from any of the RAM devices.

Besides limiting operational speed, the length of the interconnect lines effect the amount of power consumed by the device or subsystem because the capacitance of the interconnect lines generally increases as their length increases. A semiconductor device constructed of CMOS devices consumes power and dissipates heat according to the following equation:

$$Power = \frac{1}{2}CV^2F,$$

where

"C"=total capacitance;
"V"=total power supplied to the device; and
"F"=bus clock frequency.

On a larger scale, the amount of power consumption and thermal dissipation by a subsystem of CMOS based semiconductor devices is approximated using the above equation for each chip and further including capacitance from the chip package and the interconnect between chips. The capacitance of the interconnect lines consumes about one-third to one-half of the power of conventional subsystems, thereby augmenting thermal power dissipation requirements.

In view of the demand for smaller and more powerful computing resources that normally consume less power and dissipate less heat in a smaller area, many semiconductor manufacturers are attempting to provide semiconductor devices having greater active layer densities (hereinafter referred to as "ultra-thin semiconductor devices"). By increasing the density of the active layers and thereby reducing the length and capacitance of the interconnect lines, power consumption and thermal dissipation is reduced. For example, at least one semiconductor manufacturer has recently begun removing the substrate layer of the integrated circuits and vertically disposing a first active layer onto a second active layer, as evidenced by an article entitled Future WSI Technology: Stacked Monolithic WSI. The article discusses a three-dimensional ("3D") wafer scale integration process developed by Hughes Aircraft Laboratories ("Hughes") of Carlsbad, Calif. which has many disadvantages associated therewith.

A primary disadvantage is that the 3D-wafer scale integration process employs an indium bump interconnect technique which is not widely used by most semiconductor manufacturers. As a result, in order to produce ultra-thin semiconductor devices according to that technique, a semiconductor manufacturer would have to modify its fabrication process flow and equipment, which could be an enormous initial capital investment. In addition, the indium bump interconnect technique provides poor thermal dissipation since heat is removed from the active layers through the indium bumps, which occupy negligible surface area. Such thermal dissipation is crucial in maintaining reliable operations of any semiconductor device.

Other disadvantages associated with the 3D-wafer scale integration process is that it employs a complex computer-controlled etching process for slowly removing a desired amount of substrate in order to achieve its "thin" construction. This etching process is extremely time consuming, affecting overall production output of these semiconductor device. A further disadvantage is that the conventional 3D-wafer scale integration process is generally directed toward interconnecting two integrated circuit surfaces and is extremely difficult to successful coupling more than two integrated circuits together.

Another method for bonding two or more entire integrated circuit chips together has been developed in which Silicon Nitride is used for insulating regions of a bond and Titanium Nitride is used for the electrically conducting regions of the bond. In this process, a layer of an appropriate nitride is applied to a top and bottom surfaces of the integrated circuits. The nitrides are activated (i.e., to have an adhesive nature) to couple only two integrated circuits together through $NH_3$ plasma or a dilute hydrofluoric acid dip. Unlike the present invention, these integrated circuits are aligned through an exotic process involving etching deep trenches into a backside portion of the integrated circuit and employing an infrared microscope to check for alignment as disclosed in an article entitled Low Temperature $Si_3N_4$ Direct Bonding, authored by Bower and Ismail.

BRIEF SUMMARY OF THE INVENTION

The present invention describes an integrated circuit and its associated method for providing an ultra-thin semiconductor device. The integrated circuit comprising a plurality of active layers coupled together in close proximity in order to reduce total signal propagation delay and power consumption normally caused by metal interconnects of greater lengths. In order to produce the integrated circuit, at least two active layers are initially removed from their respective substrate after transistor processing by one of a number of methods including Silicon on Insulator ("SOI") or epitaxial etch stop ("EES") processes.

After removal of the active layers, at least one via is implemented on a bottom surface of each active layer in order to establish a mechanical and electrical connection between the via and its associated metal interconnects. Since each active layer now includes a continuous path from the metal interconnect to its associated via, the active layers may be coupled together in a via-via, via-metal interconnect or metal interconnect-metal interconnect manner. For via lamination, an ultrasonic welding tool is used to couple the active layers together. However, for a nitride lamination process, certain Nitride compounds are uniformly placed along one or both of the active layers or selectively placed between the active layers. The Nitride compounds are then activated in order to form a bond between the first and second active layers.

BRIEF DESCRIPTION OF THE DRAWINGS

The features of the present invention will become apparent from the following detailed description of the present invention in which.

DETAILED DESCRIPTION OF THE INVENTION

An integrated circuit and method are described for providing an ultra-thin semiconductor device having multiple active layers mechanically and electrically coupled together in close proximity to one another. For the scope of this application, an "active layer" as briefly defined above, is a portion of a processed wafer including a number of active devices (e.g., Bipolar Junction Transistors, Field-Effect Transistors, etc.) and metal interconnect coupling these active devices. It is contemplated that the active layer may include a passive device (e.g., resistors, capacitors, etc.)
having metal interconnect between and protruding from the active and passive devices. In the following detailed description, numerous specific materials and details are set forth. It is obvious to one skilled in the art of semiconductor design that the present invention may be practiced without these specific materials and details and that well-known process steps have not been described in detail in order to avoid obscuring the present invention. Furthermore, it should be borne in mind that the present invention should find wide application for use in any type of integrated circuit device, including but not limited to non-programmable and programmable memory, processors, controllers and the like.

Figure 1:
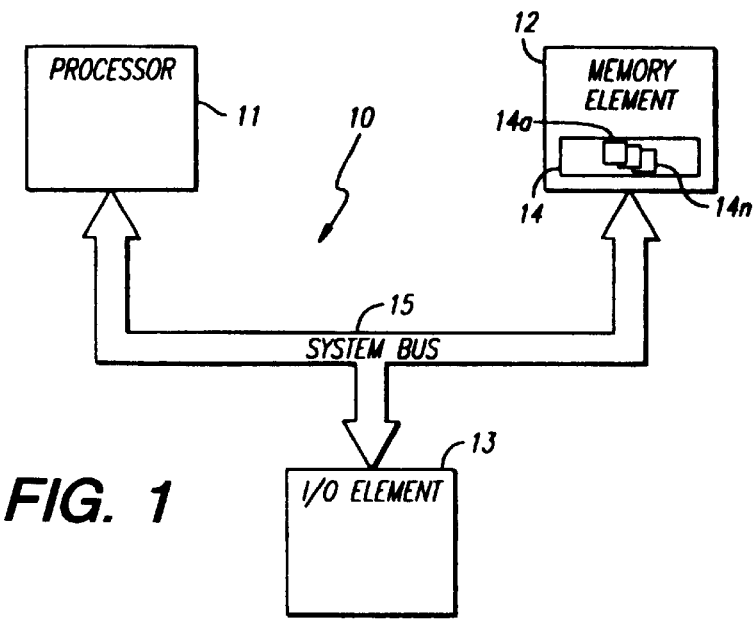
FIG. 1 is a block diagram of a computer system employing components practicing the present invention.

Referring to FIG. 1, an embodiment of a computer system 10 utilizing a memory element constructed according to the present invention is illustrated. The computer system 10 generally comprises at least a processor 11, a memory element 12 and an input/output ("I/O") element 13 coupled together through a system bus 15 to enable communication between these elements. In this embodiment, the memory element 12 is fabricated as an ultra-thin semiconductor device by including a plurality of "active layers" 14a–14n (where "n" is an arbitrary number) coupled together by one of the processes described below. These active layers 14a–14n are vertically stacked and coupled in a chosen address scheme to provide a large addressable memory space and adequate thermal dissipation.

The present invention, which is described for illustrative purposes in connection with memory but applies to any semiconductor device especially CMOS-type components, reduces an interconnect distance between these active layers 14a–14n. The reduction in interconnect distance greatly enhances storage and retrieval speed of the computer system 10. The reason for this speed enhancement is that signal propagation delays usually realized by the memory element 12 are substantially reduced. In addition, due to this reduction in interconnect distance, a semiconductor device constructed of CMOS devices tends to consume less power because the total capacitance (e.g., board capacitance, package capacitance, interconnect signal line capacitance, etc.) is reduced. Thus, the memory element 12 can be packaged to have a higher density of active layers.

The ultra-thin semiconductor device is fabricated by sequentially performing two independent steps. A first step describes the formation and removal of an active layer from a first surface of the processed wafer. A second step includes the preparation and disposition of the active layer for providing an electrical and mechanical connection with at least another active layer while maintaining minimal overhead.

A. Forming and Removing the Active Layer

The active layer can be formed and primarily removed by a variety of methods leaving minimal topology over the exposed surfaces of the active layer. A first notable method for removing the active layer includes a Silicon on Insulator ("SOI") process, which is illustrated in FIGS. 2–8, respectively. For ease of illustration, the widths of the materials layers forming the active layers of the ultra-thin semiconductor device in the active layer circuit, are not drawn to scale.

Figure 2:
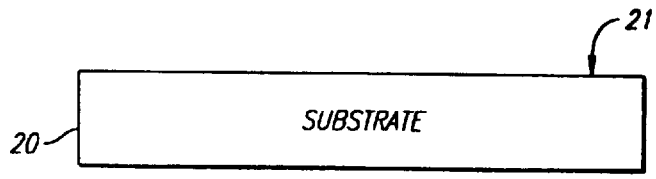
FIGS. 2–8 is a cross sectional view of the Silicon On Insulator process for removing an active layer from a substrate layer of a semiconductor device.
Figure 3:
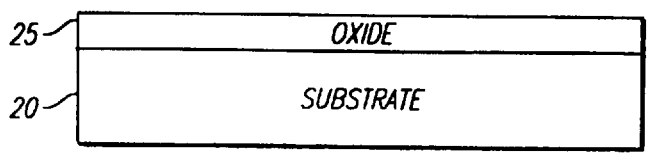

According to the SOI process, a substrate 20 typically made of semiconductive material (e.g., silicon) is obtained as shown in FIG. 2. Next, as illustrated in FIG. 3, a layer of "field oxide" 25 is deposited or grown over a top surface 21 of the substrate 20 by a well-known technique such as thermal oxidation or chemical vapor deposition. The field oxide 25, typically silicon dioxide ("SiO$_2$") or any equivalent, operates as a spacing agent for the substrate 20 and a resultant epi layer. It is desirable to utilize the field oxide 25 for its insulative characteristics and its structural integrity in holding an entire wafer together after processing. The thickness of the field oxide 25 can vary significantly, but in its preferred embodiment, the thickness is approximately 0.1 µm to 10.0 µm.

Figure 4:
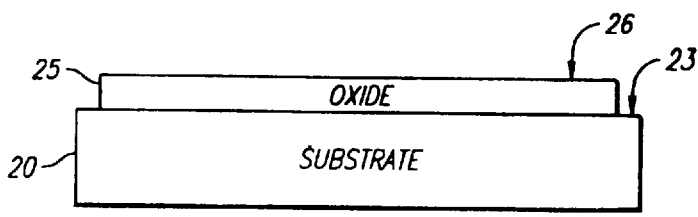
Figure 5:
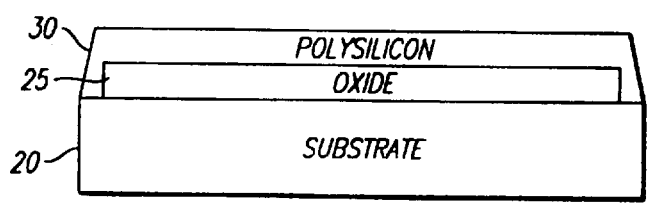

Referring to FIG. 4, the field oxide 25 is etched so that a ring 23 of the substrate 20 is exposed around a perimeter of the field oxide 25 in order to expose the crystal lattice of the substrate 20. Thereafter, as shown in FIG. 5, a layer of device-grade polysilicon 30 is uniformly deposited over a top surface 26 of the field oxide 25 (see FIG. 4). The thickness of the polysilicon layer 30 can vary significantly, but in its preferred embodiment, the thickness is approximately 0.1 µm to 10.0 µm.

Figure 6:
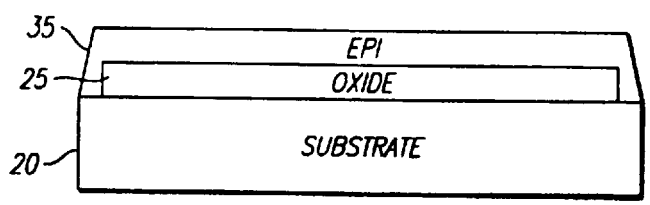

After the polysilicon 30 has been deposited, it is annealed to the field oxide 25 by applying a temperature slightly below a melting temperature of the polysilicon 30 so as to convert the polysilicon 30 into a layer of epitaxy ("epi") 35 with a crystallographic axis in alignment with the substrate 20 (FIG. 6). The epi 35 is base material for the active and passive devices. The thickness of the epi 35 is preferably 0.1 µm to 10.0 µm, but it is contemplated that the thickness could vary slightly from its preferred thickness.

Figure 7:
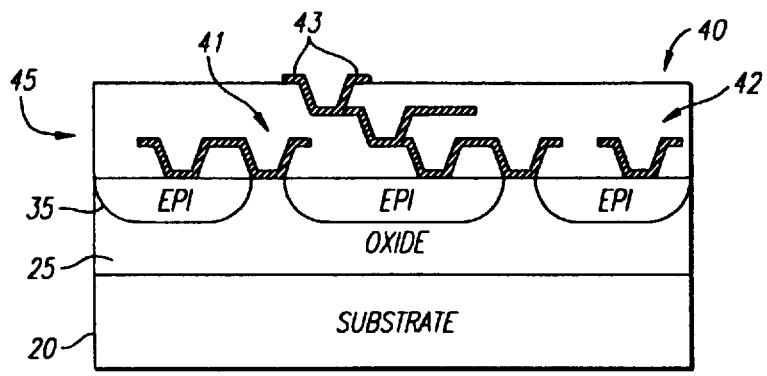
Figure 8:
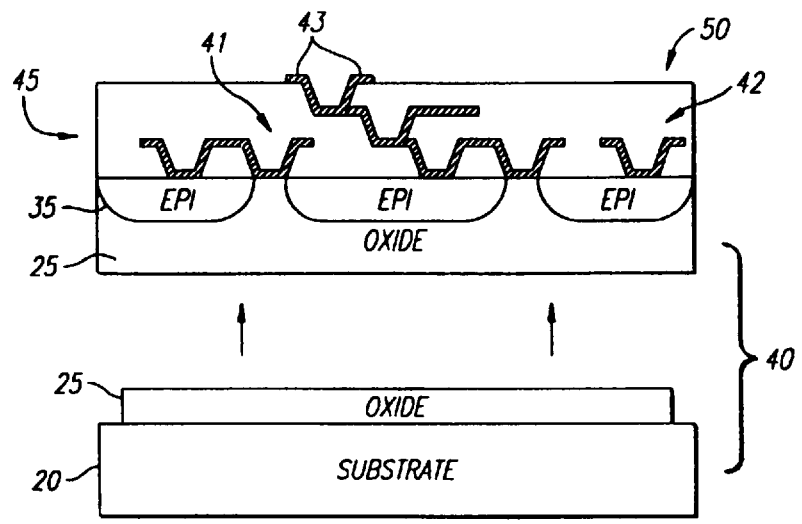

Referring now to FIG. 7, the wafer is processed to form an integrated circuit 40 through conventional wafer processing techniques known to a person skilled in the art. Thus, it is desirable for the field oxide 25 to completely penetrate the epi 35 in order to isolate adjacent active devices in the epi 35. Of course, such penetration may require additional field oxide to be added during conventional wafer processing. In FIG. 7, a metal interconnect 45, typically a plurality of metal interconnect lines 41 generally separated from each other by a dielectric material 42, is constructed over the epi 35 to form the active and passive devices. Moreover, the metal interconnect 45 further includes a first set of pads 43 at a passivation surface (i.e., outermost metal interconnect lines) coupled to a predetermined number of the metal interconnect lines 41 to support electrical coupling with other integrated circuits. Thereafter, as shown in FIG. 8, the metal interconnect 45, epi 35 with a portion of the field oxide 25 (collectively being the "active layer" 50) of the integrated circuit 40 is removed from the substrate 20 by etching under any conventional techniques, such as etching or thermal shock, to separate the active layer 50 from the substrate 20 while leaving a portion of the field oxide 25 with the substrate 20.

Figure 9:
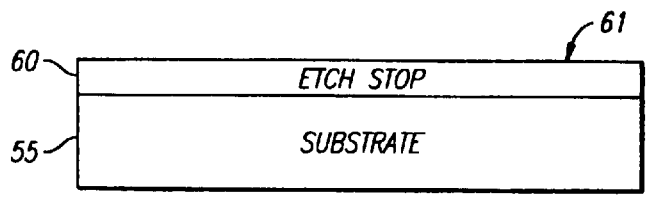
FIGS. 9–12 is a cross sectional view of the Epi Etch Stop process for removing an active layer from a substrate layer of a semiconductor device.

Alternatively, another method for forming and removing the active layer is an epitaxial etch stop ("EES") process illustrated in FIGS. 9–12. In the EES process, a substrate 55, made of many semiconductor materials as described above, is doped with a polarity opposite from an initial polarity of the substrate 55 or with a dopant concentration quite different from the initial concentration. Such doping forms an etch stop 60 being a layer of conductive material on the substrate 55 as shown in FIG. 9. The thickness of the etch stop 60 can vary significantly, but in its preferred embodiment, the thickness is approximately between 1.0 µm to 10.0 µm.

Figure 10:
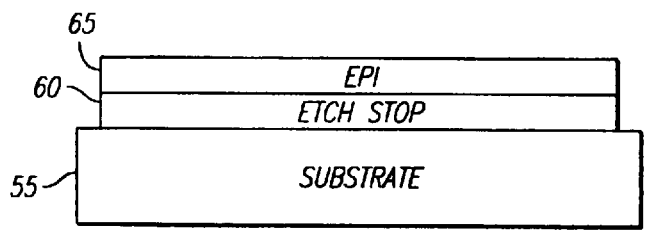
Figure 11:
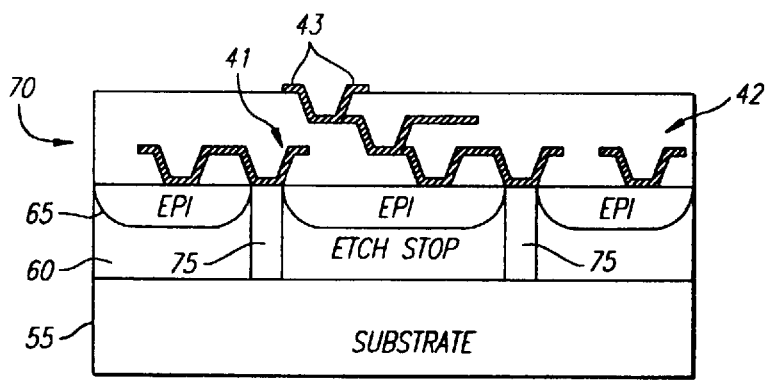
Figure 12:
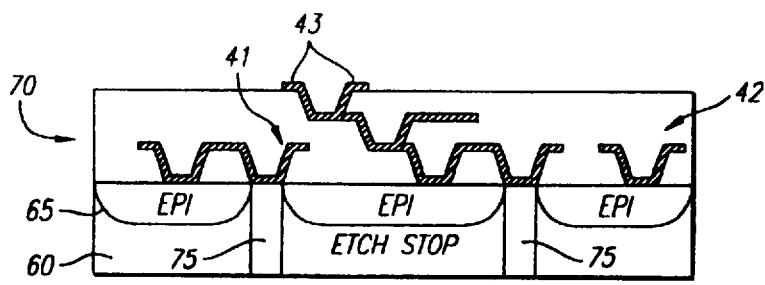

Referring now to FIG. 10, a layer of epi 65 is deposited or grown on a top surface 61 of the etch stop 60 in which the epi 65 has a preferred thickness between approximately 0.1 µm to 10.0 µm. Similar to FIG. 7, the epi 65 is then processed into active devices which operate in combination with metal interconnect 70 to form an integrated circuit (FIG. 11). One of the steps in processing the epi 65 into active devices involves thermal oxidation ensuring that field oxide 75 penetrates through the wafer and separates the epi 65. By applying voltage to the epi 65 and the etch stop 60 and submerging the integrated circuit into an appropriate etch bath, it causes the substrate 55 to be etched up to the etch stop 60 as shown in FIG. 12, leaving the metal interconnect 70, epi 65 separated by field oxide 75 and etch stop 60 virtually intact. Alternatively, if the substrate 55 is doped with the different dopant concentration, a selective etch can be used to stop upon detection of the dopant concentration.

B. Preparing and Interconnecting the Active Layers

The second step in forming the ultra-thin semiconductor device is preparing and disposing a first active layer formed in the above described manner onto a second active layer also formed in the above described manner, and electrically and mechanically coupling the first and second active layers together while maintaining sufficient yet minimal separation. There exist two processes which can be followed for coupling active layers together; namely, a via lamination process or a nitride bonding process.

Figure 13:
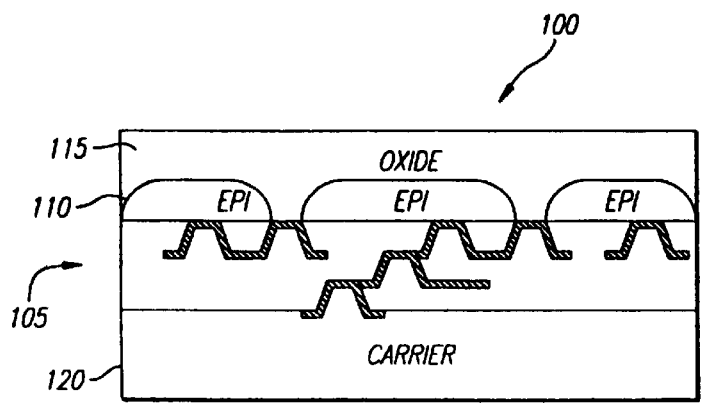
FIGS. 13–17, 18a, 18b, 19–20 is a cross sectional view of the Via lamination process for coupling one active layer to another active layer.

Referring to FIGS. 13–20, the via lamination process creates metalization on a bottom surface of an active layer and vias to electrical and mechanical couple the active layer with other active layers contrary to the practice of conventional active device processing. In FIG. 13, a first active layer 100 obtained from the SOI process described above, comprises metal interconnects 105 disposed on epi 110 and field oxide 115. The first active layer 100 is turned upside-down for exposing a backside of the first active layer for coupling purposes and is temporarily adhered to a carrier 120, usually another Silicon substrate, by an adhesive typically made of a thermoplastic soluble in an organic solvent. Such adhesion is done for handling purposes. Then, if necessary, an additional amount of field oxide may be deposited so that any locations to be used as feed-throughs (i.e., a cavity having at least one opening where the cavity extends through the field oxide 115 between the epi 110 and possibly continuing up to a passivation surface of the metal interconnect 105) have been oxidized through the full thickness of the first active layer 100. The combined thickness of the field oxide 115 and the additional oxide may be of the same order as the inter-layer dielectric for conformity of wafer processing.

Figure 14:
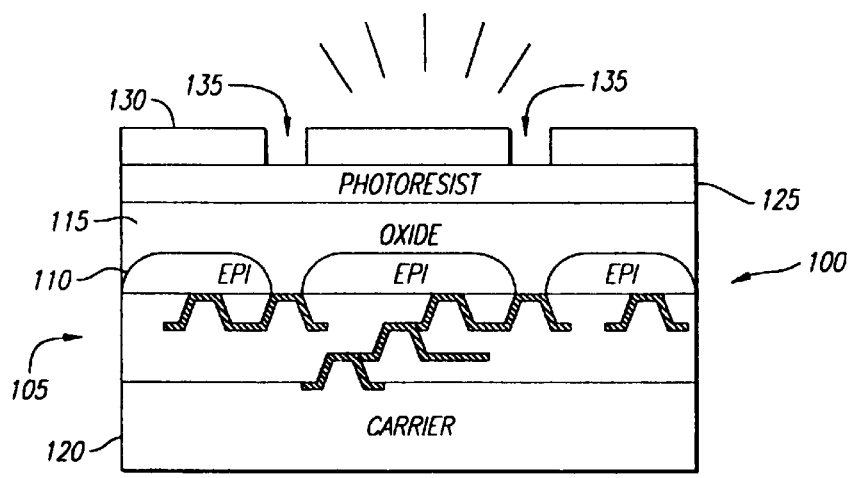
Figure 15:
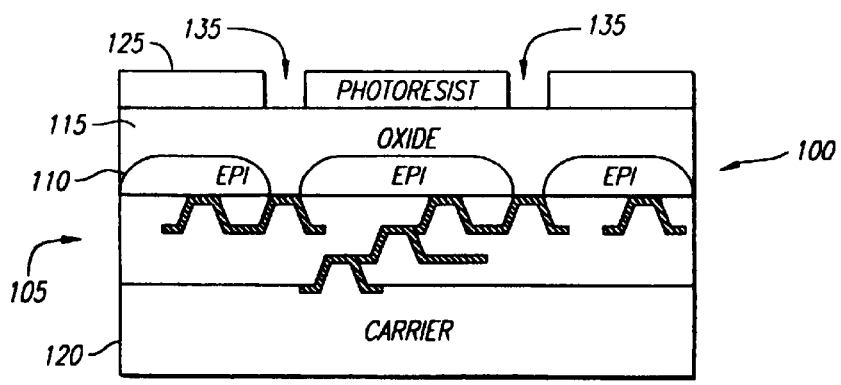
Figure 16:
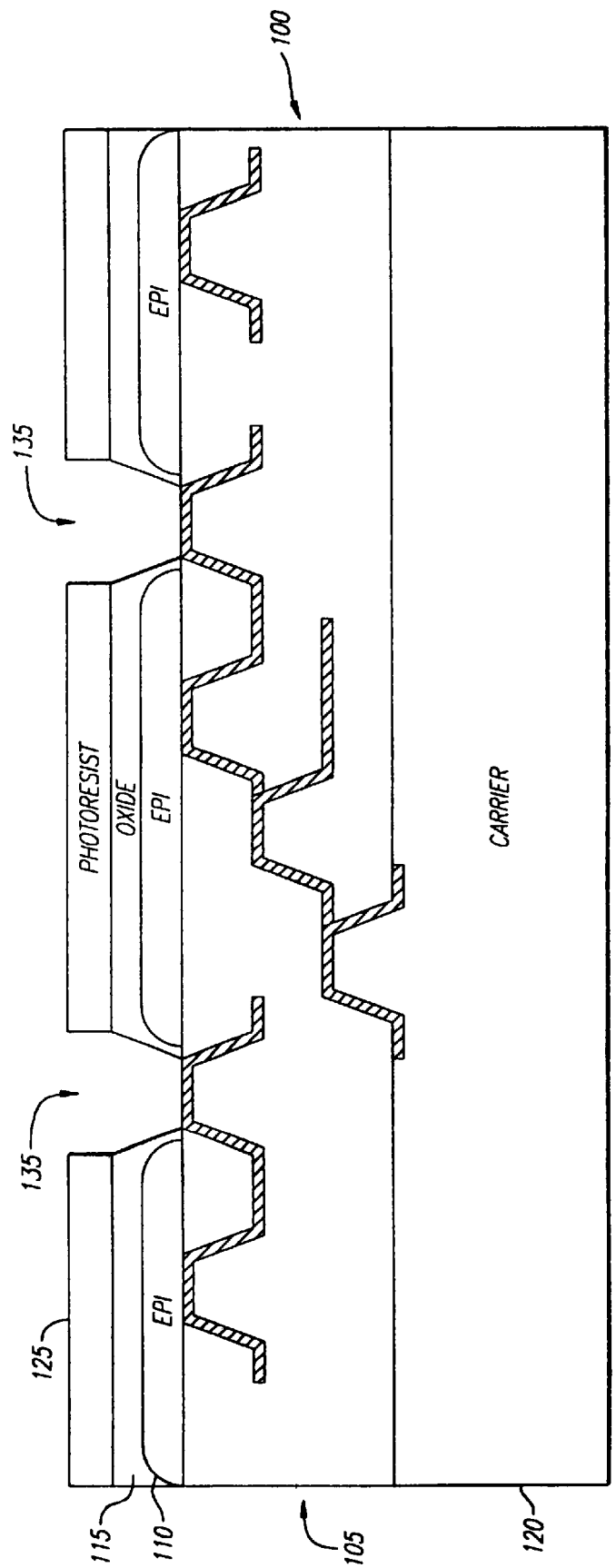
Figure 17:
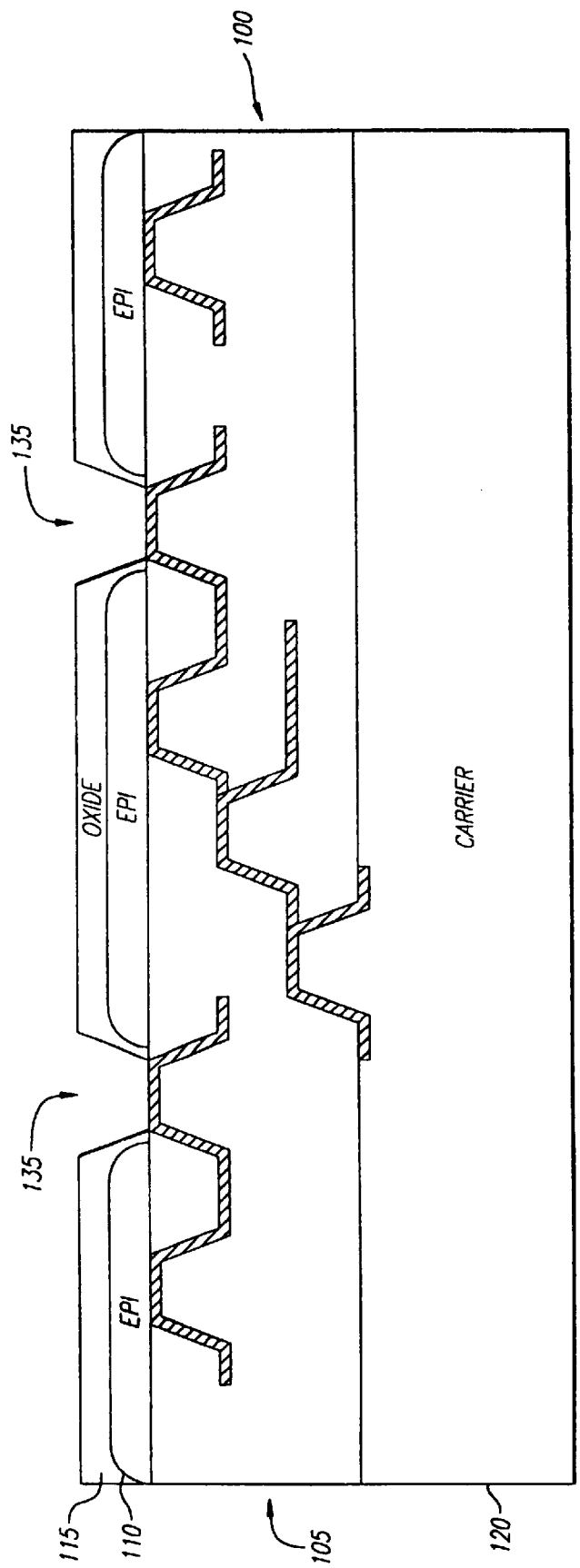

Referring now to FIG. 14, a photo-resist 125 is applied to the field oxide 115 and, in addition, a mask 130 is applied over the photo-resist 125 in certain regions where it is desirous for the photo-resist 125 to remain on the field oxide 115. The photo-resist 125 is exposed and developed using a variety of well-known prior art photolithographic techniques to expose any potential feed-throughs 135 (FIG. 15). Next, the carrier 120 and the first active layer 100 are acid or plasma etched in order to provide a number of feed-throughs 135 being smaller in diameter than a predetermined spacing between the epi 110 as shown in a more detailed view in FIG. 16. Thereafter, as shown in FIG. 17, the remaining photo-resist 125 is stripped from the field oxide 115 of the first active layer 100 to prepare for the construction of the vias.

Figure 18A:
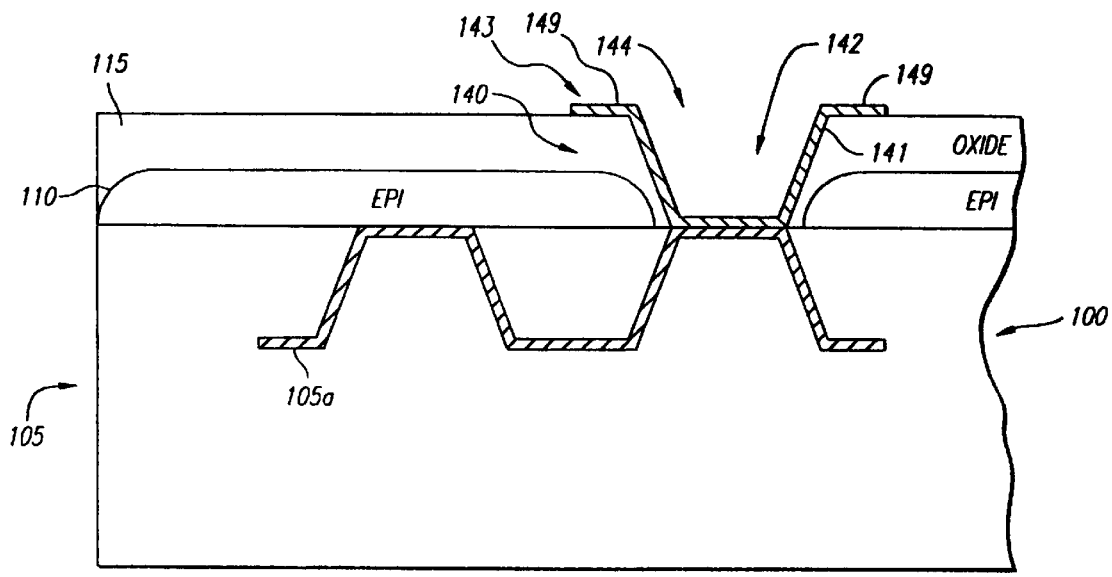

The vias are formed for establishing (i) a mechanical and electrical connection with the metal interconnect 105, (ii) a bus structure connecting multiple active layers or (iii) are left unconnected. There are two types of vias which may be used to couple multiple active layers together; namely "sidewall vias" 140 as shown in FIG. 18*a* and "solid post" vias shown in FIG. 18*b*. With reference to FIG. 18*a*, a "sidewall via" 140 which is formed by depositing only enough metal 141 into the feed-throughs 142 to establish the electrical and mechanical connection with the metal interconnect lines 105a as shown in FIG. 18*a*. The sidewall via 140 is generally downward-sloped in order to form a via ring 143, a ring of metal surrounding an opening 144 of the sidewall via 140. The via ring 143 is used for establishing a mechanical and electrical connection between the first active layer 100 and at least a second active layer. The sidewall via 140 is less costly to implement and is commonly done on lower-cost semiconductor components such as inexpensive memories.

Figure 18B:
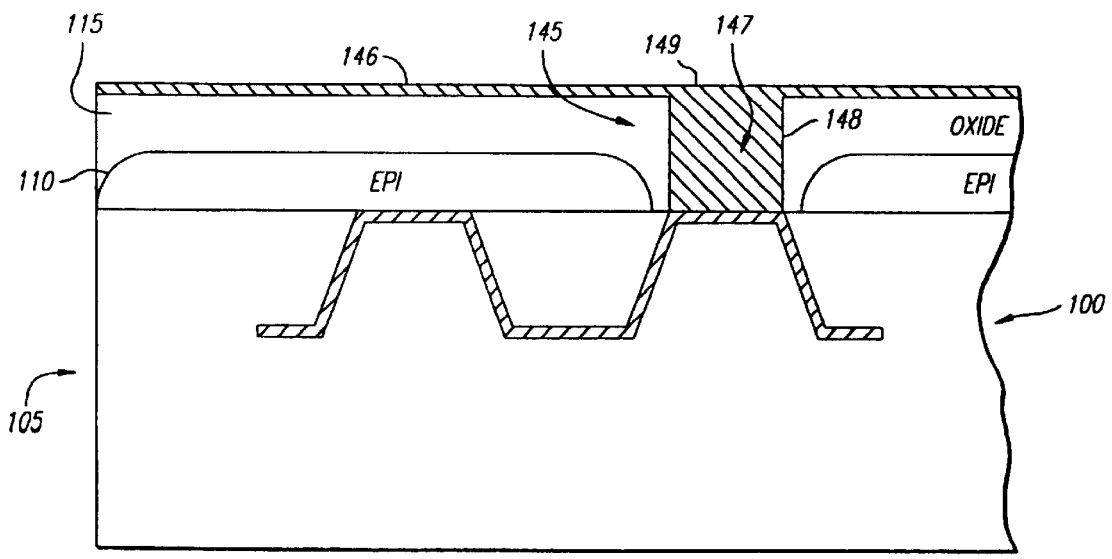
Figure 19:
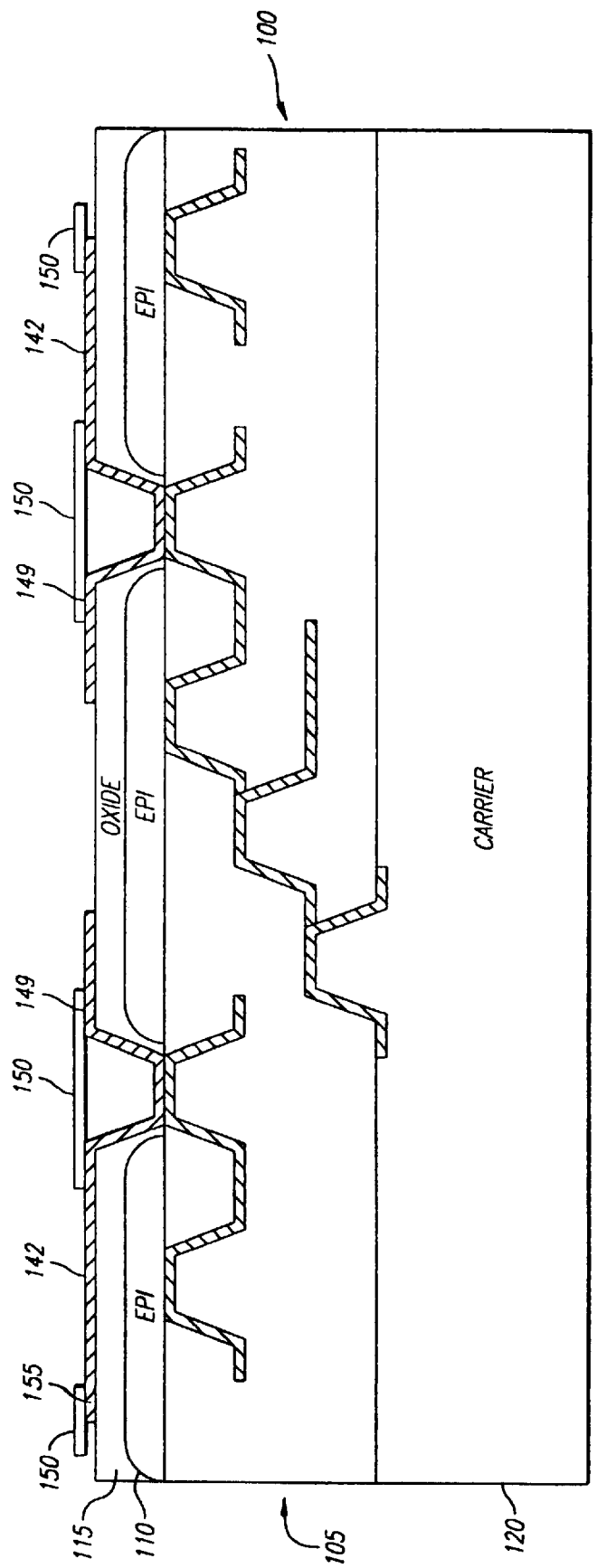
Figure 20:
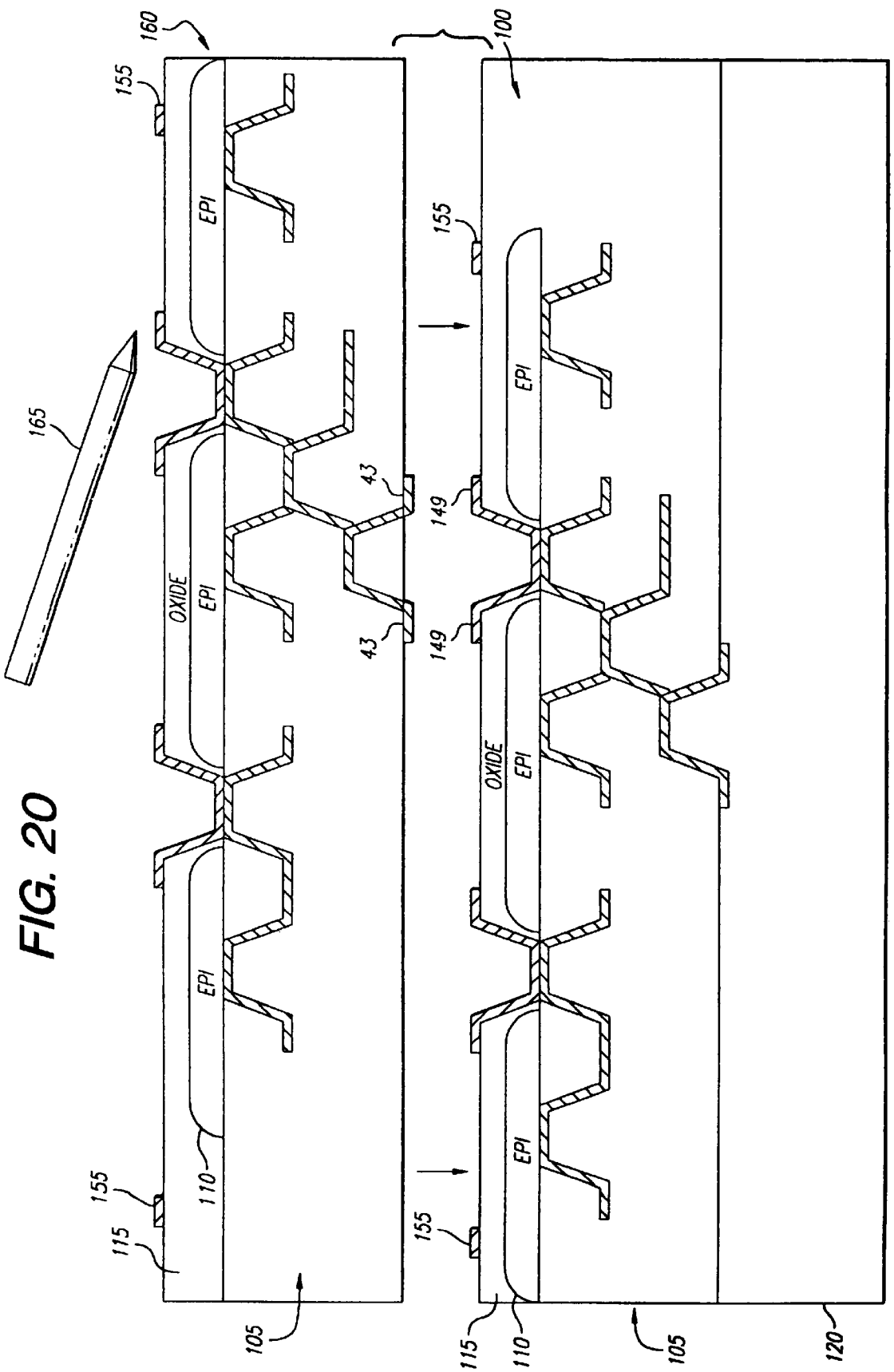

Alternatively, as shown in FIG. 18*b*, a "solid post" via 145 may be formed by depositing approximately 1 μm of metal 146 across the bottom surface of the first active layer 100 (e.g., the field oxide 115) to fill a number of feed-throughs 147 with a "post" 148 of metal. Thereafter, a surface 148 formed by the metal 146 is planarized by a chemical-mechanical polish treatment in an attempt to create a void-free bond between the first active layer 100 and at least another active layer. The solid post via 145 provides greater routing density because coupling between the two active layers occurs at a non-annular reference point (i.e., the post 148) rather than an annular reference (i.e., the via ring 143). Regardless of which via type is used, after the feed-through 142 or 147 has been filled with metal 141 or 146, a second set of pads 149 is deposited on each via ring 143 or post 148 to connect a plurality of active layers together as shown in FIGS. 19 and 20. These pads 149 are used to establish better connectivity between the via and another via or a metal interconnect line.

Using the sidewall via construction for illustrative purposes, more photo-resist material 150 is deposited on various locations of the metal layer 142 to isolate the sidewall vias 140 to establish electrical connections through the vias 140 (FIG. 19). Also, the photo-resistant material 150 is applied in predetermined spaced strips across the bottom surface (i.e., the field oxide layer 115) so that after again being exposed and developed, some strips of metal 155 remain on the oxide layer 115 to keep the stacked layers parallel and non-warping, while ensuring that encapsulating resin will undergo capillary action and be drawn between the multiple layers of active layers and assist with heat conduction as shown in FIG. 20. At this point, it is possible to wafer probe the semiconductor device to find the functional integrated circuits on the epi layer 110 and to record their locations. Thereafter, these functional integrated circuits are gently remove from the carrier 120 by dissolving the carrier 120 in organic solvent.

Referring now to FIG. 20, in order to connect two or more active layers together, it is first necessary to attach the first active layer 100 to the carrier 120. This could be a permanent attachment such as by thermosonically bonding or a temporary attachment with adhesive as mentioned above. A second active layer 160, formed in a manner similar to the first active layer 100, is aligned with the first active layer 100 by aligning their vias. For both these active layers, one set of pads (i.e., the first set of pads 43) is fabricated during ordinary processing for producing the other set of pads (i.e., the second set of pads 149) is fabricated subsequently on a bottom surface of the active layers. These first and second set of pads 43 and 149 provide a connective means to both sides of the active layer. Note that the pads on the top side are provided on the top surface of the active layer, not recessed into the passivation as would be done for chips being prepared for wire bonding.

Thereafter, the vias of the first and second active layers 100 and 160 are properly aligned to establish an electrical connection therebetween. Such alignment, normally accomplished through visual manipulation since the active layers have virtually transparent window of field oxide, may include aligning (i) the first set of pads of the second active layer 160 with the second set of pads for the first active layer 100; (ii) the first set of pads of the second active layer 160 with the first set of pads for the first active layer 100; or (iii) the second set of pads of the second active layer 160 with the second set of pads for the first active layer 100. For illustrative purposes, the first alignment option listed above is shown. Each of the first and second set of pads for the second and first active layers 160 and 100, respectively, is touched with a thermosonic bonding tip 165 so that each aligned vias of the first and second active layers 100 and 160 are ultrasonically welded together. Alternatively, however, if the vias are sidewall vias, it is necessary to bond the vias at its via ring. It may also be possible to bond by laser welding with certain metals such as gold.

Figure 21:
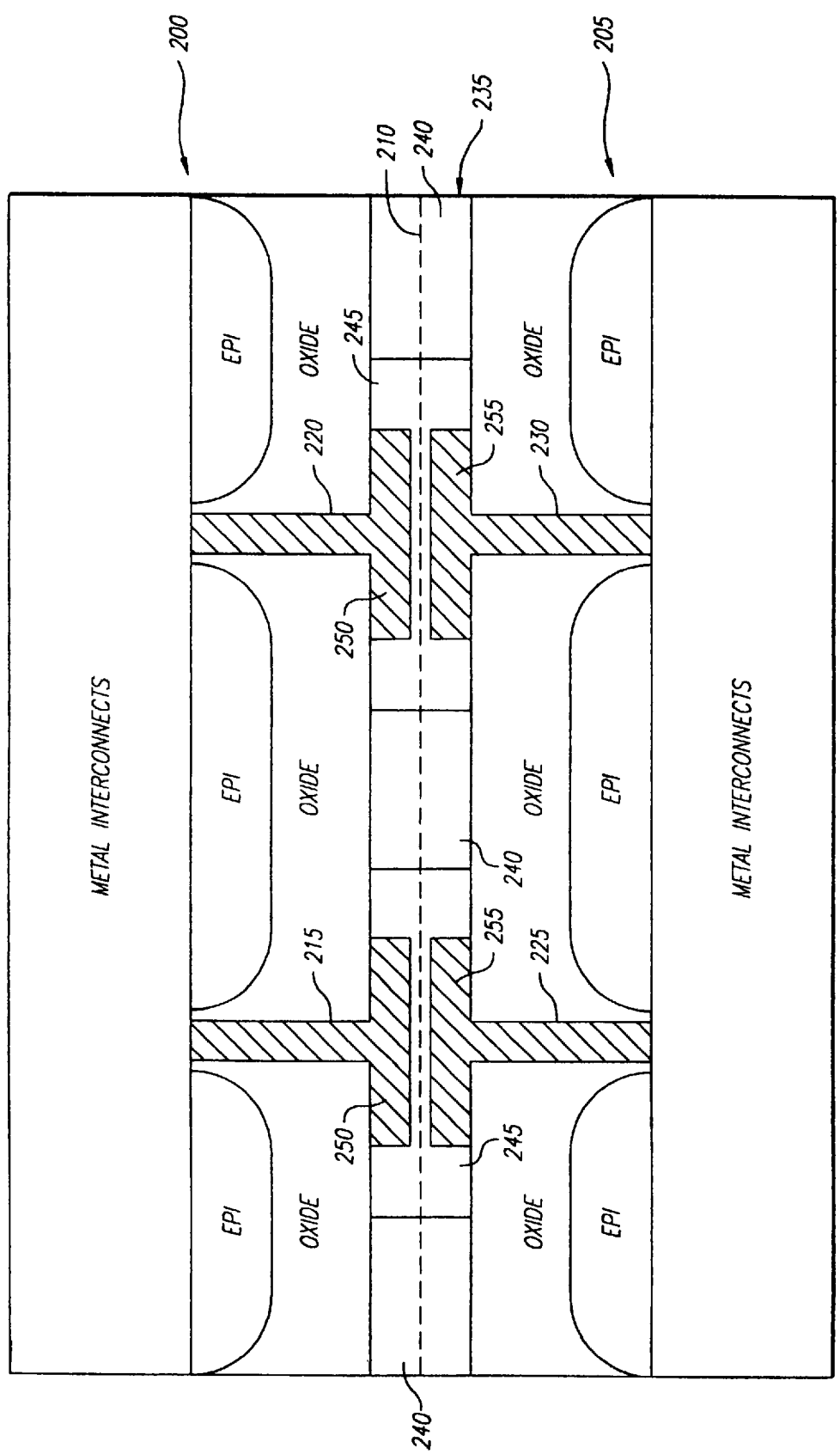
FIG. 21 is a cross-sectional view of the Nitride lamination process for coupling together at least two active layers having solid post vias.
Figure 22:
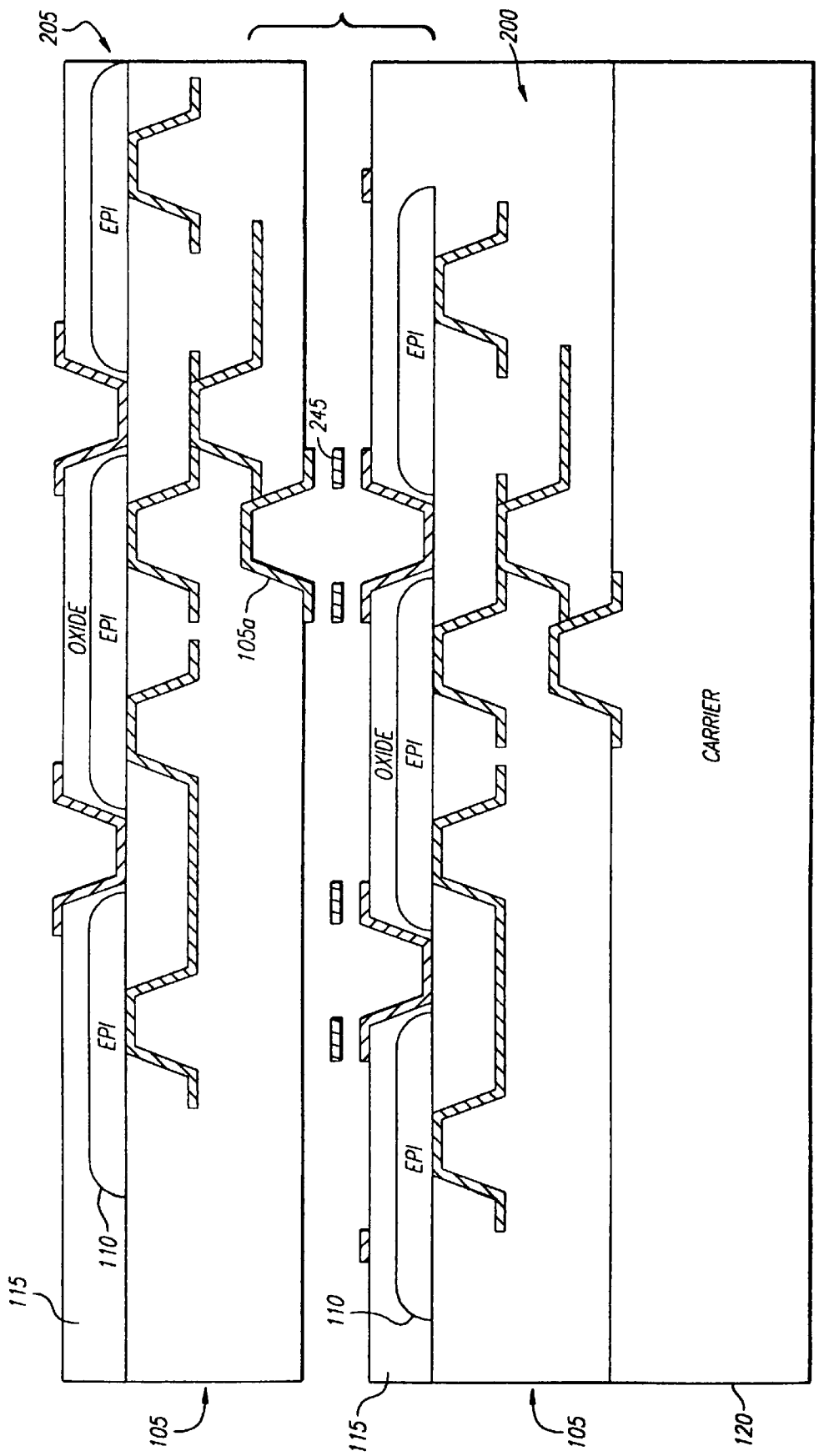
FIG. 22 is a cross-sectional view of the Nitride lamination process coupling together at least two active layers having sidewall vias.

With respect to the Nitride lamination process, for illustrative purposes, the bonding of bottom surfaces of a pair of active layers featuring solid post vias is shown in FIGS. 21 and 22. This illustration exemplifies how Nitride bonding is performed, but should not be construed as a limitation on possible stacking orientations of the present invention. It is contemplated that the active layers could be stacked in a variety of orientations such that the active layers are (i) consistent in orientation (top surface of an active layer opposite the bottom surface of another active layer mounted thereon) (ii) opposite in orientation (bottom surface of an active layer opposite the bottom surface of another active layer mounted thereon); (iii) alternating in orientation and the like.

Referring to FIG. 21, a first and second active layers 200 and 205, defined by the dotted line 210 being a line of interconnection between a bottom surface of the first active layer 200 and a top surface of the second active layer 205, comprise a number of solid post via 215–230 are bonded together with a Nitride bonding element 235 in an opposite orientation. The Nitride bonding element 220, which includes Silicon Nitride 240 for insulative regions (e.g., field oxide) or Titanium Nitride 245 for conductive regions (e.g., metal), is applied in a uniform manner along a bottom surface of the first active layer 200. By applying the Nitride bond element 245 uniformly across the entire bottom surface, including a set of pads 250 associated with the solid post vias 215 and 220, any "bimetal" effect is canceled to a first order. In addition, a uniform bond between the first active layer 200 and a second active layer 205 distributes any mechanical stress across their entire surface instead of focusing the stress on the solid post vias 215–230. This Nitride bonding element 235 can be activated with either a NH$_3$ plasma or a dilute hydrofluoric ("HF") acid bath.

Since the first and second active layers 200 and 205 are typically planar when employing solid post vias, two depositions are necessary to selectively place Titanium Nitride 245 along the conductive regions and over the pads 250 and Silicon Nitride 240 along the insulative regions. This sequence occurs by depositing Silicon Nitride 240 over the entire bottom surface of the first active layer 200. Thereafter, the Silicon Nitride 240 is photo-etched to form openings over the pads 250. Next, Titanium Nitride 245 is deposited over the entire bottom surface of the first active layer 200 and the Titanium Nitride 245 is polished (i.e., chemical-mechanical polish) to remove the Titanium Nitride 245 except as plugs for the opening over the pads 250. It is contemplated, however, that the Nitride bonding element 235 could be applied uniformly across the active layer 205 or applied exclusively to the pads 250 of the first active layer 200 and/or pads 255 of the second active layer 205 to affix them together. For example, Titanium Nitride 245 may be applied along the entire bottom surface of the first active layer 200 and then lithographically defined to remove it from everywhere except the pads 250.

With respect to the Nitride lamination process for active layers having sidewall vias, it is generally preferred that the sidewall vias are electrically connected by selectively bonding only the sidewall vias together as shown in FIG. 22. To do so, Titanium Nitride 245 is selectively applied to the pads 250 associated with the sidewall via of the first active layer 200 or selected pads of the interconnect lines 105a of the second active layer 205. Alternatively, it is contemplated that the Nitride Bonding element 235 could be applied to coupled together sidewall vias pads of the first and second active layers 200 and 205, metal interconnects of the first and second active layers 200 and 205 or the metal interconnect of the first active layer 200 and the sidewall via of the second active layer 205.

After applying the Nitride bonding element 235 as in FIGS. 21 and 22, the conductive and insulative regions of the first and second active layers 200 and 205 are quite easily aligned since each active layer is virtually transparent around the feed-throughs. Thereafter, the active layers 200 and 205 are annealed for a few hours to complete the Nitride bonding. However, for optimum results, both the top and bottom surfaces of the active layers 200 and 205 should be smooth and planar in order to achieve proper adhesion and avoid active layers voids when more than two active layers are vertically disposed.

Figure 23:
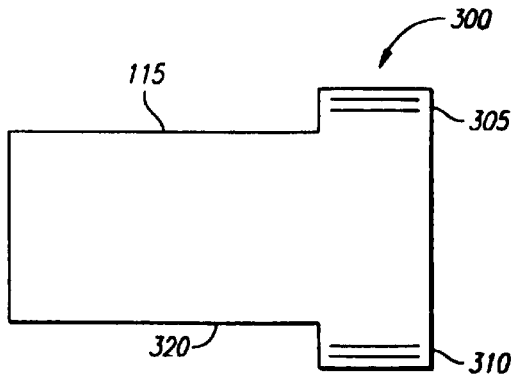
FIG. 23 is a plan view of another embodiment of the present invention being a plurality of contact ultra-thin semiconductor devices having strips to establishing electrical contact with other similar integrated circuits.
Figure 24:
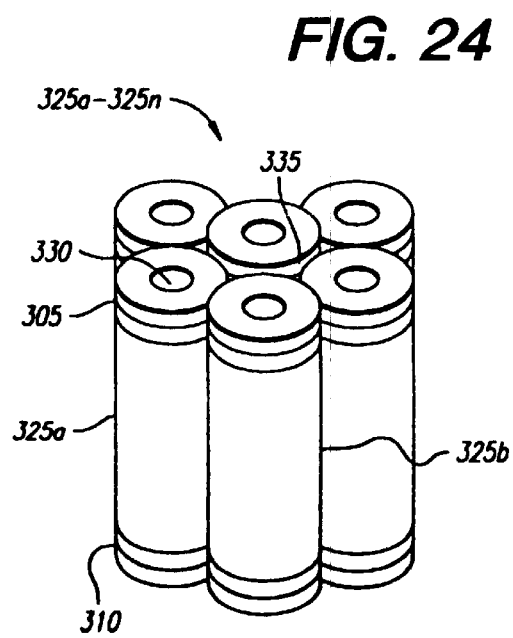
FIG. 24 is a prospective view of the embodiment of FIG. 23 being rolled-up and situated in a polygonal array.

Referring now to FIG. 23, it is contemplated that another embodiment of the ultra-thin semiconductor device is to stack a number of rolled-up integrated circuits into a polygonal array. For example, assume that an integrated circuit 300 has a pair of contact strips (e.g. metal interconnects of convenient width and separation), 305 and 310 arranged on two edges 315 and 320, respectively, so that these contact strips 305 and 310 are obtainable when the integrated circuit is rolled-up. By obtaining at least one integrated circuit identical to the integrated circuit 300, it would be possible to spot weld the contact strips together where two adjacent rolled up circuits 325a and 325b are in contact as shown in FIG. 24. This embodiment is advantageous for circuits with relatively high power density because coolant can flow through an open space 330 in a center of the rolled up circuit and in the gaps 335 between the rolled-up circuits.

Rolled up circuits 325a–325n (where "n" is an arbitrary number) are also a way of placing significant intelligence on micro-miniature actuators that are built in the form of small cylinders. This would be much more efficient than to build circuits on tightly curved surfaces. It is, of course, possible, to stack heterogeneous layers. For example thin films of opto-electronic sources and emitters could be laminated on top of films of silicon control circuits.

The compound semiconductors commonly used for electro-optical devices such as GaAs, InGaAs and related compounds can be fabricated as thin active layers over substrates in a process closely related to the epi etch stop method described above. After these layers have been removed from their carriers, it is possible to use either via lamination or nitride lamination to attach them to silicon active layers containing circuitry to control the electro-optical devices. Oxide windows, as described above for alignment purposes, can be used to permit light to penetrate the silicon layers as necessary for the use of the electro-optical devices.

C. Thermal Management

Thermal management dictates whether or not any potential ultra-thin semiconductor device is practical. It is obvious that stacking active layers pose an obvious thermal path problem. This problem can be alleviated through a number of ways. One option is to power up one or a few active layers at any one time such as, for example, by re-arranging an address scheme for the memory elements so that only one or a couple memory elements are fully powered at any one time. The above-identified thermal vias may be incorporated through the ultra-thin semiconductor device to provide metal paths capable of dissipating heat. In extreme cases, it is contemplated that a hollow via could be produced to accommodate a circulating liquid coolant.

For stacks with eight layers, with a power density of ¾ W/cm$^2$, as is typical for current Static Random Access Memory chips, the temperature rise to the top of the stack is less than two centigrade in a one dimensional simulation. However, it is contemplated that actual temperature gradients in any given component depend on the details of both the chip construction and the lamination technology. One important variable is the inter-layer dielectric used. For example, an oxide has much better thermal conductivity than a polyimide. In addition, the fraction of metal coverage and number of vias are also important.

The present invention described herein may be designed in many different methods and using many different configurations. While the present invention has been described in terms of various embodiments, other embodiments may come to mind to those skilled in the art without departing from the spirit and scope of the present invention. The invention should, therefore, be measured in terms of the claims which follow.

What is claimed is:

1. A method for coupling a first active layer of a first semiconductor device and a second active layer of a second semiconductor device in which both said first and second active layers function as complete integrated circuits, the method comprising the steps of:

removing said first active layer from said first semiconductor device and said second active layer from said second semiconductor device, at least the first active layer including a first layer of a transparent insulative material, a second layer of epitaxial partially deposited over said insulative material, and a metal interconnect partially placed over the first and second layer;

forming a first interconnect via on a bottom surface of said first active layer by a via lamination process;

forming a second interconnect via on a bottom surface of said second active layer; and joining said first active layer and said second active layer by (i) visually aligning a first pad on said first active layer with a second pad on said second active layer by viewing through a portion of the insulative material not covered by one of the second layer and metal interconnect, and (ii) electrically coupling said first active layer with said second active layer.

2. The method according to claim 1, wherein after said step of forming said first interconnect via, said method further includes the step of:

electrically and mechanically coupling said first interconnect via on said bottom surface of said first active layer to a metal interconnect on a top surface of said first active layer.

3. The method according to claim 2, wherein after said step of forming said second interconnect via, said method further includes the step of:

electrically and mechanically coupling said second interconnect via on said bottom surface of said second active layer to a metal interconnect on a top surface of said second active layer.

4. The method according to claim 3, wherein said joining step includes the steps of:

aligning said first interconnect via of said first active layer and said second interconnect via of said second active layer so that said first pad associated with said first interconnect via of said first active layer is disposed generally opposite to said second pad associated with said second interconnect via of said second active layer; and coupling said first pad to said second pad to establish an electrical connection from said metal interconnect on said top surface of said first active layer to said metal interconnect on said top surface of said second active layer.

5. The method according to claim 3, wherein said joining step includes the steps of:

aligning said first interconnect via of said first active layer and said metal interconnect of said second active layer so that said first pad associated with said first interconnect via of said first active layer is disposed generally opposite to a said second pad associated with said metal interconnect of said second active layer; and coupling said first pad to said second pad to establish an electrical connection from said metal interconnect on said top surface of said first active layer to said second interconnect via on said bottom surface of said second active layer.

6. The method according to claim 3, wherein said joining step includes the steps of:

aligning said metal interconnect of said first active layer and said second interconnect via of said second active layer so that said first pad associated with said metal interconnect of said first active layer is disposed generally opposite to said second pad associated with said second interconnect via of said second active layer; and coupling said first pad to said second pad to establish an electrical connection from said first interconnect via on said bottom surface of said first active layer to said metal interconnect on said top surface of said second active layer.

7. The method according to claim 3, wherein said joining step includes the steps of:

aligning said metal interconnect of said first active layer and said metal interconnect of said second active layer so that said first pad associated with said metal interconnect of said first active layer is disposed generally opposite to said second pad associated with said metal interconnect of said second active layer; and coupling said first pad to said second pad to establish an electrical connection from said first interconnect via on said bottom surface of said first active layer to said second interconnect via on said bottom surface of said second active layer.

8. A method for coupling a first active layer of a first semiconductor device to a second active layer of a second semiconductor device, the method comprising the steps of:

forming a first interconnect via on a bottom surface of said first active layer which is electrically and mechanically coupled to a metal interconnect placed on a top surface of said first active layer;

forming a second interconnect via on a second surface of said second active layer which is electrically and mechanically coupled to a metal interconnect placed on a top surface of said first active layer;

visually aligning said first interconnect via of said first active layer and said second interconnect via of said second active layer so that a pad of said first interconnect via of said first active layer is disposed generally opposite to a pad of said second interconnect via of said second active layer, said visually aligning step is accomplished by viewing through a window of insulative material unobscured by the metal interconnect within the first active layer;

applying a Nitride bonding element to one of said pad of said first interconnect via and said pad of said second interconnect via;

joining said pad of said first interconnect via on said bottom surface of said first active layer and said pad of said second interconnect via on said bottom surface of said second active layer to said Nitride bonding element; and activating said Nitride bonding element to couple said first active layer to said second active layer.

9. A method for creating an electronic device comprising the steps of:

separating a first active layer from a first semiconductor device, said first active layer functioning as a complete integrated circuit and including a field oxide layer, an epitaxy layer partially deposited over and disjoined by the field oxide layer and a metal interconnect partially placed over said field oxide layer and said epitaxy layer allowing for at least one field oxide window to be present;

forming a first interconnect via within said field oxide layer of said first active layer by undergoing a first etching process;

separating a second active layer from a second semiconductor device, said second active layer including a field oxide layer, an epitaxy layer deposited over and disjoined by the field oxide layer and a metal interconnect placed over said field oxide layer and said epitaxy layer;

forming a second interconnect via within said field oxide layer of said second active layer by undergoing a second etching process; and joining said first active layer and said second active layer by (i) visually aligning a first pad on said first active layer with a second pad on said second active layer by viewing through the at least one field oxide window of the first active layer, and (ii) electrically coupling said first active layer with said second active layer.

10. The method according to claim 9, wherein prior to said step of forming said first interconnect via, the method further comprises the steps of:

testing said first active layer to determine if said first active layer is operational; and testing said second active layer to determine if said second active layer is operational.

11. The method according to claim 9, wherein said step of forming said first interconnect via includes the steps of etching said field oxide layer of the first active layer to produce a feedthrough without contacting said epitaxy layer, and applying metal to said feedthrough to produce said first interconnect via establishing an electrical coupling to said metal interconnect of the first active layer.

12. The method according to claim 11, wherein said step of forming said second interconnect via includes the step of:

etching said field oxide layer of the second active layer to produce a feedthrough without contacting said epitaxy layer, and applying metal to said feedthrough to produce said second interconnect via establishing an electrical coupling to said metal interconnect of the second active layer.

13. The method according to claim 12, wherein said joining step includes the steps of:

aligning said first interconnect via of said first active layer and said second interconnect via of said second active layer so that said first pad associated with said first interconnect via of said first active layer is disposed generally opposite to said second pad associated with said second interconnect via of said second active layer; and coupling said first pad to said second pad to establish an electrical connection from said metal interconnect of said first active layer to said metal interconnect of said second active layer.

14. The method according to claim 12, wherein said joining step includes the steps of:

aligning said first interconnect via of said first active layer and said metal interconnect of said second active layer so that said first pad associated with said first interconnect via of said first active layer is disposed generally opposite to said second pad associated with said metal interconnect of said second active layer; and coupling said first pad to said second pad to establish an electrical connection from said metal interconnect of said first active layer to said second interconnect via of said second active layer.

15. The method according to claim 12, wherein said joining step includes the steps of:

aligning said metal interconnect of said first active layer and said second interconnect via of said second active layer so that said first pad associated with said metal interconnect of said first active layer is disposed generally opposite to said second pad associated with said second interconnect via of said second active layer; and coupling said first pad to said second pad to establish an electrical connection from said first interconnect via of said first active layer to said metal interconnect of said second active layer.

16. The method according to claim 12, wherein said joining step includes the steps of:

aligning said metal interconnect of said first active layer and said metal interconnect of said second active layer so that said first pad associated with said metal interconnect of said first active layer is disposed generally opposite to said second pad associated with said metal interconnect of said second active layer; and coupling said first pad to said second pad to establish an electrical connection from said first interconnect via of said first active layer to said second interconnect via of said second active layer.

17. The method according to claim 9, wherein said joining step includes the steps of:

visually aligning said first pad to be disposed generally opposite to said pad of said second interconnect via;

applying a Nitride bonding element to at least one of said first and second pads;

joining said first pad and said second pad with said Nitride bonding element; and activating said Nitride bonding element to couple said first active layer to said second active layer.

18. The method according to claim 9, wherein at least one of said separating steps includes an epitaxial etch stop process.

19. The method according to claim 1, wherein said removing step includes the step of performing an epitaxial etch stop process on one of the first and second active layers.

* * * * *